(12) United States Patent
Marquart et al.

(10) Patent No.: US 11,049,830 B2
(45) Date of Patent: Jun. 29, 2021

(54) LEVEL SHIFTING BETWEEN INTERCONNECTED CHIPS HAVING DIFFERENT VOLTAGE POTENTIALS

(71) Applicant: International Business Machines Corporation, Armonk, NY (US)

(72) Inventors: Chad Andrew Marquart, Austin, TX (US); Daniel M. Dreps, Georgetown, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/540,181

(22) Filed: Aug. 14, 2019

(65) Prior Publication Data

US 2021/0050318 A1    Feb. 18, 2021

(51) Int. Cl.
| | | |
|---|---|---|
| *H01L 23/00* | (2006.01) | |
| *H01L 23/538* | (2006.01) | |
| *H01L 23/528* | (2006.01) | |
| *H03K 19/0185* | (2006.01) | |
| *H01L 21/48* | (2006.01) | |
| *H01L 25/065* | (2006.01) | |

(52) U.S. Cl.
CPC .......... *H01L 24/16* (2013.01); *H01L 21/4857* (2013.01); *H01L 23/5286* (2013.01); *H01L 23/5381* (2013.01); *H01L 23/5386* (2013.01); *H01L 24/81* (2013.01); *H01L 25/0655* (2013.01); *H03K 19/018521* (2013.01); *H01L 2224/16225* (2013.01)

(58) Field of Classification Search
CPC .............. H01L 24/17; H01L 25/0655; H01L 2224/16225; H01L 23/5381; H01L 24/24; H01L 24/18; H01L 23/5386; H01L 24/81; H01L 21/4857; H01L 24/16; H01L 23/5286

See application file for complete search history.

(56) References Cited

U.S. PATENT DOCUMENTS

| | | |
|---|---|---|
| 4,958,133 A | 9/1990 | Bazes |
| 7,692,474 B2 | 4/2010 | Stegmayr |
| 8,089,813 B2 | 1/2012 | Dreps et al. |
| 8,664,909 B2 | 3/2014 | Sumida et al. |

(Continued)

FOREIGN PATENT DOCUMENTS

| | | |
|---|---|---|
| CN | 205485900 U | 8/2016 |
| CN | 109245535 A | 1/2019 |

(Continued)

OTHER PUBLICATIONS

Miller, David A. B., "Device Requirements for Optical Interconnects to Silicon Chips", Proceedings of the IEEE, vol. 97, No. 7, Jul. 2009, © 2009 IEEE, 1166-1185.

(Continued)

*Primary Examiner* — Jasmine J Clark
(74) *Attorney, Agent, or Firm* — Aaron N. Pontikos

(57) ABSTRACT

An input/output (I/O) interface of a die is disclosed. The I/O interface of the die includes a first region of a backside of the die. The I/O interface further includes a second region of the backside surface of the die positioned along at least a portion of a perimeter of the first region. The second region provides power and ground connections to the first region.

20 Claims, 9 Drawing Sheets

(56) References Cited

U.S. PATENT DOCUMENTS

| | | | |
|---|---|---|---|
| 9,059,715 B2 | 6/2015 | Hsu et al. | |
| 2018/0226364 A1* | 8/2018 | Kim | H01L 23/49827 |
| 2019/0204376 A1* | 7/2019 | Goyal | G01R 23/20 |

FOREIGN PATENT DOCUMENTS

| | | |
|---|---|---|
| CN | 109285583 A | 1/2019 |
| WO | 2019013788 A1 | 1/2019 |

OTHER PUBLICATIONS

Ukaegbu et al., "Design of full-duplex and multifunction bidirectional CMOS transceiver for optical interconnect applications", Opt Quant Electron (2017) 49:243, 14 pages, DOI 10.1007/s11082-017-1078-4, © Springer Science+Business Media, LLC 2017.

* cited by examiner

LEVEL SHIFTING BETWEEN INTERCONNECTED CHIPS HAVING DIFFERENT VOLTAGE POTENTIALS

BACKGROUND OF THE INVENTION

The present invention relates generally to the field of integrated circuits, and more particularly to packaging of integrated circuits.

In electronics, a three-dimensional (3D) integrated circuit (IC) is a chip or combination of chips in which two or more layers of active electronic components are integrated both vertically and horizontally into a single circuit. 3D packaging saves space by stacking separate chips in a single package. A multi-chip module (MCM) is a specialized electronic package where multiple integrated circuits (ICs), semiconductor dies or other discrete components are packaged onto a unifying substrate, facilitating their use as a single component. The MCM itself will often be referred to as a "chip" in designs, thus illustrating its integrated nature. This packaging, known as System in Package (SiP) or Chip Stack MCM, does not integrate the chips into a single circuit. Instead, the chips in the package communicate using off-chip signaling, much as if they were mounted in separate packages on a normal circuit board.

A SiP is a number of integrated circuits enclosed in a single module (i.e., package). The SiP performs all or most of the functions of an electronic system, and is typically used, for example, inside mobile phones, digital music players, etc. Dies containing integrated circuits, may be stacked vertically on a substrate. In some cases, they are internally connected by fine wires that are bonded to the package. Alternatively, with flip chip technology, solder bumps are used to join stacked chips together. SiP dies can be stacked vertically or tiled horizontally, unlike slightly less dense multi-chip modules, which place dies horizontally on a carrier. SiP connects the dies with standard off-chip wire bonds or solder bumps, unlike slightly denser three-dimensional integrated circuits which connect stacked silicon dies with conductors running through the die. Many different 3-D packaging techniques have been developed for stacking many more-or-less standard chip dies into a compact area.

An example SiP can contain several chips (such as a specialized processor, DRAM, flash memory) combined with passive components, for example resistors and capacitors, which are mounted on the same substrate. This means that a complete functional unit can be built in a multi-chip package, so that few external components need to be added to make it work. This is particularly valuable in space constrained environments as it reduces the complexity of the package substrate and overall design.

SUMMARY

Embodiments of the present invention disclose an input/output (I/O) interface of a die. The I/O interface of the die includes a first region of a backside of the die. The I/O interface further includes a second region of the backside surface of the die positioned along at least a portion of a perimeter of the first region. The second region provides power and ground connections to the first region.

BRIEF DESCRIPTION OF THE SEVERAL VIEWS OF THE DRAWINGS

FIG. 7 illustrates voltage level-shifting for a signal on the first die upstream of a driver circuit.

FIG. 8 illustrates voltage level-shifting for a signal on the first die downstream from a receiver circuit.

DETAILED DESCRIPTION

Package technologies with high density chip-to-chip interconnects enable input/output (I/O) interfaces to achieve high bandwidth through the use of a large number of parallel I/O circuits operating at "relatively" low data rates per interconnect. I/O circuits operating at lower or slower data rates tend to have greater tolerance to supply voltage variation compared with more complex I/O circuits operating at higher or faster data rates per interconnect. This increased tolerance provides an opportunity to eliminate the need for low-noise, fixed-voltage supplies typically dedicated for high speed I/O interfaces. Furthermore, the removal of a dedicated I/O voltage supply for circuits can reduce complexity, latency, and power for high density I/O interfaces. However, embodiments of the present invention recognize that the lack of a dedicated I/O power supply can introduce electrical concerns if two interconnected dies are powered by voltage supplies that are capable of being independently set and altered.

Embodiments of the present invention recognize that, from a power management perspective, it can be advantageous to have different voltage set points for dies communicating through the interface. For example, the voltage supply for two interconnected dies may be independently set for each die based on the speed of the process of a given die to optimize power versus performance. In another example, the voltage supply for two interconnected dies may be dynamically and independently varied for each die based on the workload of the processor or the instantaneous current load on the voltage regulator. However, the potential for differences in voltage set points for two interconnected dies attempting to electrically communicate can result in excessive self-heating, excessive electromigration, and excessive power leakage for interfacing circuits if the voltage difference between two interconnected dies is significant.

Figure 1A:
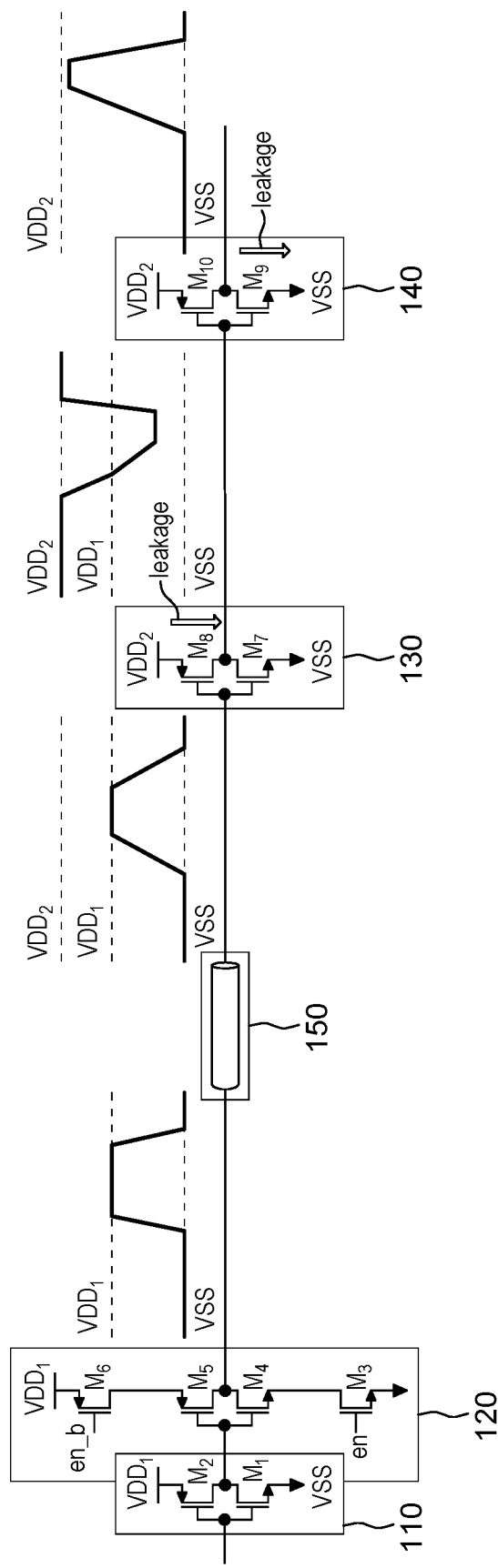
FIG. 1A is a schematic diagram of a simple input/output (I/O) interface for a chip-to-chip interconnect.

Turning now to the Figures, FIG. 1A is a schematic diagram of a simple input/output (I/O) interface for a chip-to-chip interconnect that illustrates a first shortcoming of current chip packages. FIG. 1A includes pre-driver 110 and driver 120, which are located on a first die (not depicted), receiver circuit 130 and receiver circuit 140, which are located on a second die (not depicted), and interconnect 150, which allows for the transfer of data between an I/O interface of the first die and an I/O interface of the second die. Pre-driver 110 includes field-effect transistors (FETs) $M_1$ and $M_2$, driver 120 includes FETs $M_3$-$M_6$, receiver circuit 130 includes FETs $M_7$ and $M_8$, and receiver circuit 140 includes FETs $M_9$ and $M_{10}$.

More specifically, FIG. 1A illustrates the problems that can occur when the voltage potential ($VDD_1$) of driver 120 located on a first die is less than the voltage potential ($VDD_2$) of receiver 130 and receiver 140 located on a second die downstream from the first die. For example, if $VDD_1$ on die 1 is less than $VDD_2$ on die 2, then field-effect transistor (FET) $M_8$ on die 2 may not go into a cutoff state as the gate voltage swings up to $VDD_1$. Furthermore, if the gate source voltage (VGS) on FET $M_8$ is large enough, it can cause excessive drain to source leakage current. Additionally, this drain to source leakage current on FET $M_8$ can prevent the gate voltage on FET $M_9$ from swinging down to VSS (ground). Moreover, if the VGS on FET $M_9$ is significant enough, it can also lead to excessive drain to source leakage current on FET $M_9$.

One of ordinary skill in the art will appreciate that leakage current over time can add up to a significant increase in power consumption across a large number of parallel I/O circuits across the I/O interface of interconnected dies. One of ordinary skill in the art will further appreciate that leakage current can lead to self-heating for affected FETs (e.g., FET $M_8$ and FET $M_9$) as well as the surrounding regions of the affected FETs, which ultimately can lead to an increase risk for electromigration for those wires and/or vias (VIAs) located within the surrounding region. Moreover, if the wires and/or vias attached to the affected FETs (e.g., FET $M_8$ and FET $M_9$) are not properly sized to carry such higher or larger currents, the risk of electromigration for those wires and/or vias can occur regardless of the temperature impact caused by localized self-heating.

Figure 1B:
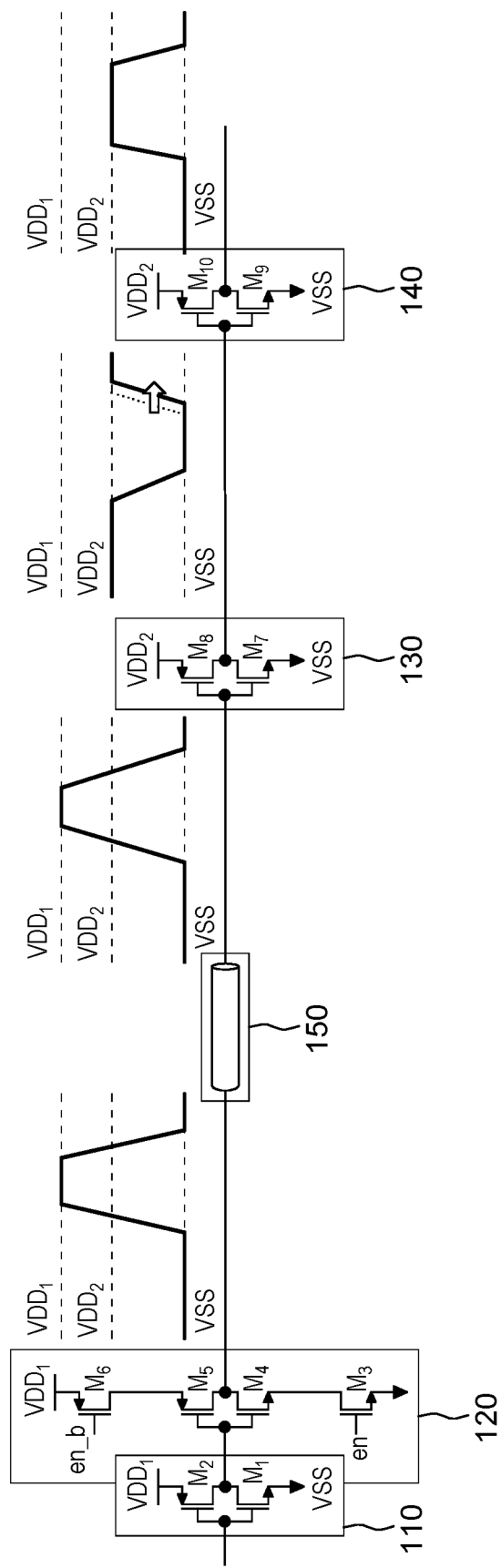
FIG. 1B is a schematic diagram of a simple input/output (I/O) interface for a chip-to-chip interconnect.

FIG. 1B is a schematic diagram of a simple input/output (I/O) interface for a chip-to-chip interconnect that illustrates a second shortcoming of current chip packages. FIG. 1B includes pre-driver 110 and driver 120, which are located on a first die (not depicted), receiver circuit 130 and receiver circuit 140, which are located on a second die (not depicted), and interconnect 150, which allows for the transfer of data between an I/O interface of the first die and an I/O interface of the second die. Pre-driver 110 includes FETs $M_1$ and $M_2$, driver 120 includes FETs $M_3$-$M_6$, receiver circuit 130 includes FETs $M_7$ and $M_8$, and receiver circuit 140 includes FETs $M_9$ and $M_{10}$.

More specifically, FIG. 1B illustrates the problems that can occur when the voltage potential ($VDD_1$) of driver 120 located on a first die (not depicted) is greater than the voltage potential ($VDD_2$) of a receiver located on a second die (not depicted). For example, if $VDD_1$ on the first die is greater than $VDD_2$ on the second die, then the switch point of $VDD_1$/$VDD_2$ upstream of FETS $M_7$ and $M_8$ is larger than the switch point of $VDD_2$/$VDD_2$ for circuits downstream. One of ordinary skill in the art will appreciate that this difference in logic voltage at the switch point of the gates can significantly skew signal arrival times (signified by the arrow showing a delay in the signal arrival time), especially for signals operating at slow slew rates (i.e., a maximum rate at which an amplifier can respond to an abrupt change of input level). One of ordinary skill will further appreciate that such skews in signal arrival times can cause significant duty-cycle distortion for clock signals, as well as limit the performance of data signals from a timing perspective.

Embodiments of the present invention recognize several deficiencies with current solutions to the above mentioned problems. One possible solution to such problems involves chip packages having a dedicated I/O voltage supply that is common to I/O circuits of two interconnected dies (i.e., the voltage supplies running to each die have similar voltage levels). In scenarios such as this, the dedicated I/O voltage supply is common between two interfacing dies since the I/O circuits or devices running on each die have similar voltage requirements. However, these chip packages require two voltage-level translations to occur, both to and from the dedicated I/O voltage rail. This ultimately results in increased signal latency and the need for a level-shift translator at the interface point of each interconnected die. This ultimately results in an additional cost and wasted chip space due to the need for a second voltage-level shift translator. Moreover, the requirement for two voltage-level translations can also impact power consumption as the voltage set point for the dedicated I/O rail must be set high enough to overcome the worst-case permissible process (e.g., 3 sigma process or 5 sigma process) and noise profile across all dies being interfaced.

Another possible solution to such problems involves chip packages having additional interconnects that forward an analog voltage reference from a driver on a first die to a receiver on a second die. The analog reference voltage can be used to bias a high gain differential receiver circuit on a second receiver die, which is capable of rail-to-rail output swing depending on whether the data signal has a voltage greater than or less than the forwarded voltage reference. However, this is disadvantageous in that the signal density of chip-to-chip interconnects is reduced in order to allocate a portion of the chip-to-chip interconnects (i.e., taking up a portion of the routing tracks in the package substrate) for voltage reference forwarding. Moreover, utilizing analog voltage reference forwarding requires more complex I/O circuits, which require more power and die area to achieve performance similar to less complex I/O circuits using a common or smaller voltage supply.

Embodiments of the present invention reduce and/or eliminate various shortcomings caused when a voltage potential of a first die is greater than or less than a voltage potential of a second, interconnected die. Embodiments of the present invention provide a low cost, power efficient method and chip package structure for chip-to-chip interconnects where power supplies for each I/O input of a chip are capable of independently being set to different voltage potentials. In various embodiments, a dedicated power supply rail of each chip is delivered to the attach region of I/O circuits interfacing two interconnected dies. This is particularly advantageous in that it allows for the I/O circuits to source power from the voltage supplies for both dies being interfaced, thereby ultimately requiring only a single voltage-level translation across the interface. It should be noted that this single voltage-level translation between the power supplies of both dies has the flexibility to occur either upstream of the chip-to-chip interconnect or downstream of the chip-to-chip interconnect, depending on the particular needs of a given application.

Embodiments of the present invention reduce the cost of communication or transferring data between interconnected dies that share a common voltage source by: (i) eliminating the need for a voltage regulator, (ii) eliminate the need for performing two voltage-level shifts (e.g., from a voltage domain of a first die to a common shared voltage and then from the common shared voltage to a second voltage domain of a second die); (iii) eliminating the need for two voltage-level translators when the voltage potentials of two interconnected dies are drastically different (e.g., one voltage-level translator on a first die for translating a signal from a voltage domain of a first die to a common shared voltage on a first die and a second voltage-level translator on a second die for translating the signal from the common shared voltage domain to a voltage domain of the second die); and (iv) increasing the available space on a die for additional circuits by eliminating the second voltage-level translator circuit.

Embodiments of the present invention reduce the cost of communication or transferring data between interconnected dies that utilize voltage reference forwarding by: (i) eliminating weakened signal density caused by the need for additional interconnects in the I/O attach region for voltage reference forwarding, thereby increasing signal density between chip-to-chip interconnects; (ii) reducing power consumption utilized by voltage reference circuits, thereby creating a more power efficient chip; (iii) increasing the available space on a die for additional circuits by eliminating voltage reference circuits; and (iv) increasing the available space on a die for additional circuits by decreasing the size of the I/O attach regions since only a single chip-to-chip interconnect is required.

Accordingly, embodiments of the present invention ultimately provide for the generation of an improved chip package that utilizes less complex (i.e., more efficient) I/O circuits that use a smaller voltage supply to perform a single voltage-level translation between two interconnected dies when a voltage potential of a first die is greater than or less than the voltage potential of a second, interconnected die. Embodiments of the present invention remove power supply connections (e.g., conventional controlled collapse chip connections (C4s)) from the I/O attach region, thereby allowing for more interconnects within the attach region, which ultimately results in greater signal density and communication of signals between I/O inputs of two interconnected dies. Embodiments of the present invention only supply power connections (e.g., C4s) to the outside perimeter or a portion of the outside perimeter of an I/O attach region, of which such power supply is tied into a power grid within the bottom (i.e., "backend" or "backside") metal layers of a die. Furthermore, embodiments of the present invention reduce self-heating, electromigration, and leakage current for interfacing circuits where the voltage difference between two interconnected dies is significant.

It should be noted that although embodiments of the invention are depicted as having dies that are horizontally arranged on a package substrate, embodiments of the present invention can be practiced with multiple dies stacked vertically on top of each other or tiled horizontally with respect to each other. Moreover, although illustrative examples throughout are directed towards a single voltage-level shift between two dies, embodiments of the present invention can be expanded to multi-chip modules that include more than two interconnected dies.

Accordingly, for a multi-chip module including more than two interconnected dies, a single voltage-level shift can be performed between each interconnected pair of dies having different dedicated voltage potentials.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims. Many modifications and variations of the present invention are possible in light of the above teachings, and could be apparent for those skilled in the art.

The resulting integrated circuit chips of embodiments of the present invention can be distributed by the fabricator in a packaged form. In some embodiments, the chip is mounted in a single chip package (such as, but not limited to, a plastic carrier, with leads that are affixed to a motherboard or other higher level carrier). In other embodiments, the chip is mounted in a multichip package (such as, but not limited to, a ceramic carrier having surface interconnections and/or buried interconnections). In any of these embodiments, the chip is then integrated with other chips, discrete circuit elements, and/or other signal processing devices as part of either (a) an intermediate product, such as a motherboard, or an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

It should be noted that the specification below describes various embodiments of a chip package structure, as well as a description of processing steps for forming the various embodiments of a chip package structure. While the processing steps are not described in an ordered sequence, it should be understood that the processing steps are discussed with respect to various Figures as detailed in the specification below.

Figure 2:
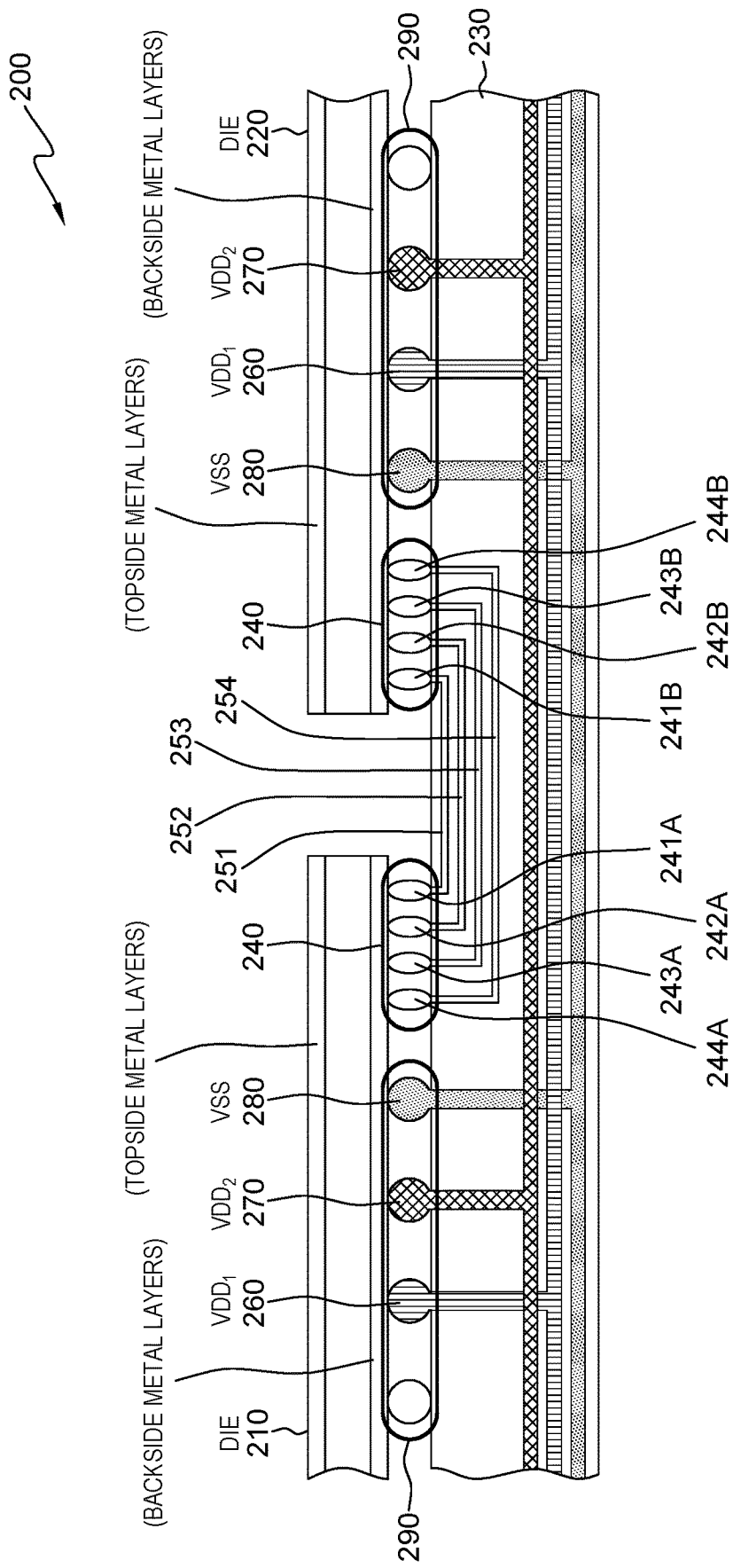
FIG. 2 illustrates a cross-section view of two dies interfaced with high density interconnects routed through a first portion of layers of a package substrate in accordance with at least one embodiment of the present invention.
Figure 3:
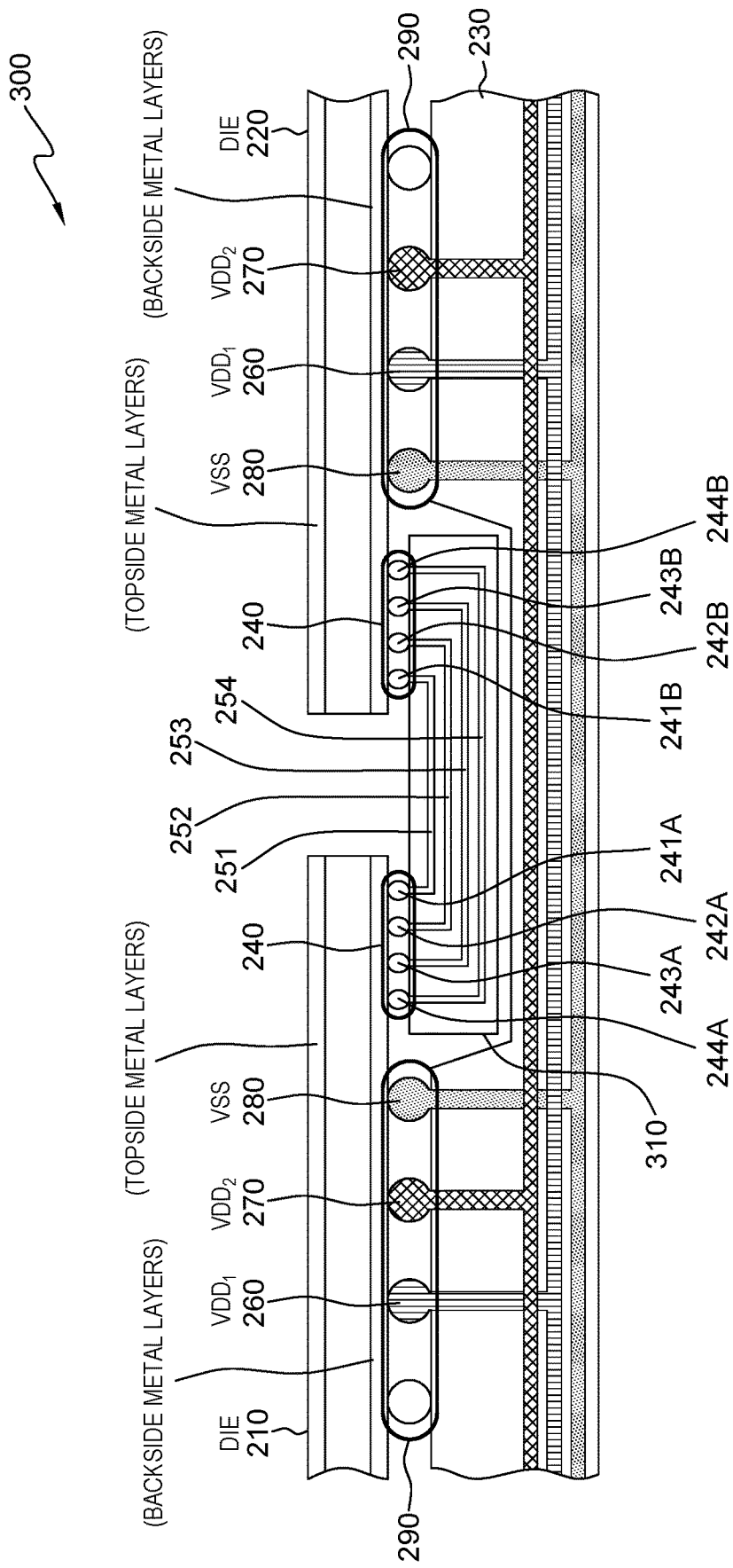
FIG. 3 illustrates a cross-section view of two dies interfaced with a silicon bridge horizontally embedded within a first portion of layers of a package substrate in accordance with at least one embodiment of the present invention.
Figure 4:
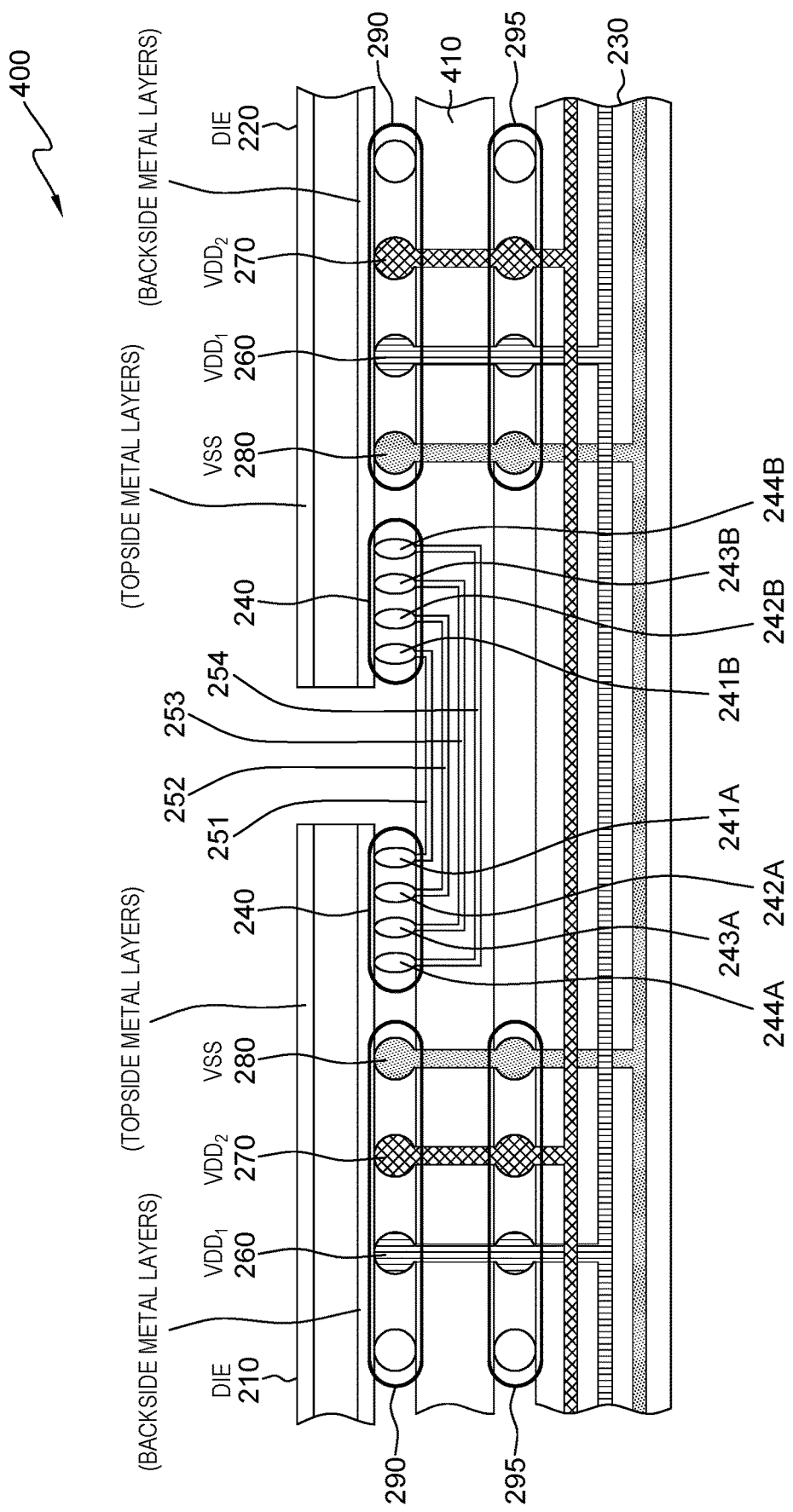
FIG. 4 illustrates a cross-section view of two dies interfaced with a silicon interposer horizontally positioned between the two dies and a package substrate in accordance with at least one embodiment of the present invention.

Returning now to the Figures, FIGS. 2-4 illustrate cross-sectional views of a portion of chip packages 200, 300, and 400, which include two interconnected dies powered by multiple power supplies in accordance with various embodiments of the present invention. It should be noted that die 210 located on chip package 200 includes I/O circuits that have an independent voltage potential (i.e., the dies logic is powered by $VDD_1$ 260) compared to the voltage potential of the I/O circuits located on die 220. Similarly, die 220 located on chip package 200 includes I/O circuits that have an independent voltage potential (i.e., the dies logic is powered by $VDD_2$ 270) compared to the voltage potential of the I/O circuits located on die 210. Accordingly, the I/O circuits on die 210 draw power from VDD$_1$ 260 and the I/O circuits on die 220 draw power from VDD$_2$ 270. However, by delivering a dedicated power supply of die 210 (VDD$_1$ 260) to die 220 in conjunction with the dedicated power supply of die 220 (VDD$_2$ 270) and delivering a dedicated power supply (VDD$_2$ 270) of die 220 to die 210 in conjunction with the dedicated power supply of die 210 (VDD$_1$ 260), a signal at a first logic level or voltage domain on die 210 that is transmitted to die 220 can be translated to a second logic level or second voltage domain of die 220 via a single voltage-level shift.

In some embodiments, the independent voltage potential of I/O circuits located on die 210 is lower than the independent voltage potential of I/O circuits located on die 220. Accordingly, the I/O circuits on die 210 require a lower voltage supply than the I/O circuits located on die 220. In other embodiments, the independent voltage potential of I/O circuits located on die 210 is higher than the independent voltage potential of I/O circuits located on die 220. Accordingly, the I/O circuits on die 210 require a higher voltage supply than the I/O circuits on die 220.

As depicted in FIGS. 2-4, chip packages 200, 300, and 400 include die 210 (an integrated circuit) and die 220 (an integrated circuit) and package substrate 230. The bottom surface of die 210 and the bottom surface of die 220 are bonded to package substrate 230. One of ordinary skill in the art will appreciate that die 210 and die 220 can be made from any generally known semiconductor materials (e.g., silicon, gallium arsenide or germanium). Similarly, one of ordinary skill in the art will appreciate that package substrate 230 can be made from any generally known substrates (e.g., a glass/ceramic substrate, an organic laminate, or printed circuit board (PCB)) that provide chip packages 200, 300, and 400 with structural base support and a form of electrical interface.

Die 210 includes I/O attach region 510 (depicted in FIG. 5 and described in further detail below) and die 220 includes I/O attach region 520 (depicted in FIG. 5 and described in further detail below) for interconnecting die 210 and die 220. An I/O attach region may generally be understood as an interface for communicating or otherwise transferring data between two or more dies. In various embodiments, an I/O attach region is a portion of the bottom or backend metal surface of a die. In some embodiments, I/O attach regions are high-density attach regions. In those embodiments where I/O attach regions are high density attach regions, an I/O attach region of a die is bonded to a portion of the top surface of package substrate 230 via microbumps 240. One of ordinary skill in the art will appreciate that a microbump is a solder ball that has a smaller diameter and is placed at a finer pitch compared to conventional controlled collapse chip connections (C4s). It should be noted that the use of microbumps 240 in an I/O attach region of a die allows for increased signal transmittance since more attach points, and thus more interconnects, can be connected within an I/O attach region. In other embodiments, I/O attach regions are not high-density attach regions. In these embodiments, an attach region of a die is bonded to a portion of the top surface of package substrate 230 via C4s.

FIG. 2 illustrates a cross-section view of chip package 200 for interfacing between die 210 and die 220 via interconnects routed through various layers of package substrate 230 in accordance with at least one embodiment of the present invention. Die 210 and die 220 are connected by interconnects 251-254 routed through a first portion of layers of package substrate 230 in accordance with at least one embodiment of the present invention. As depicted in FIG. 2, microbumps 240 are bonded to an I/O attach region of die 210, an I/O attach region of die 220, and package substrate 230 at positions corresponding to connection points of interconnects 251-254 routed through various layers of package substrate 230. However, in other embodiments, microbumps 240 are replaced with C4s (not depicted) in an I/O attach region. In these embodiments, C4s are bonded to an I/O attach region of die 210, an I/O attach region of die 220, and package substrate 230 at positions corresponding to connection points of interconnects 251-254 routed through various layers of package substrate 230. Interconnects 251-254 may be formed from any generally known materials for transmitting signal data, including, but not limited to, copper wire or tungsten.

Interconnect 251 is routed through a first layer of package substrate 230 and is connected to microbump 241A and microbump 241B. Interconnect 252 is routed through a second layer of package substrate 230 and is connected to microbump 242A and microbump 242B. Interconnect 253 is routed through a third layer of package substrate 230 and is connected to microbump 243A and microbump 243B. Interconnect 254 is routed through a fourth layer of package substrate 230 and is connected to microbump 244A and microbump 244B. However, one of ordinary skill in the art will appreciate that any number of interconnects can run through any number of layers of package substrate 230 (dependent on the number of layers of the package substrate) and that any number of interconnects can be connected to any number of microbumps and/or standard C4s bonded to an attach region of a die (dependent on the number of attach points in an I/O attach region). Interconnects 251-254 enter/exit die 210 and die 220 via microbumps 240 bonded to an I/O attach region of die 210 and an I/O attach region of die 220. In those embodiments where microbumps 240 are replaced with C4s, interconnects 251-254 enter/exit die 210 and die 220 via C4s bonded to an I/O attach region of die 210 and an I/O attach region of die 220.

FIG. 3 illustrates a cross-section view of chip package 300 for interfacing between die 210 and die 220 via interconnects routed through a bridge 310 horizontally embedded within a first portion of layers of a package substrate 230 in accordance with at least one embodiment of the present invention. As depicted in FIG. 3, microbumps 240 are bonded to an I/O attach region of die 210, an I/O attach region of die 220, and at positions on bridge 310 corresponding to connection points of interconnects 251-254 routed through various layers of a bridge 310. However, in other embodiments, microbumps 240 are replaced with C4s (not depicted) in the I/O attach regions of die 210 and die 220. In these embodiments, an I/O attach region is bonded to bridge 310 via C4s at positions corresponding to connection points of interconnects 251-254 routed through various layers of bridge 310. Interconnects 251-254 may be formed from any generally known materials for transmitting signal data, including but not limited to copper wire or tungsten. In some embodiments, bridge 310 is partially embedded within a first portion of layers of package substrate 230. However, in other embodiments, bridge 310 can be entirely embedded within package substrate 230. One of ordinary skill in the art will appreciate that bridge 310 can be made from any generally known bridge substrates including, but not limited to, silicon.

Interconnect 251 is routed through a first layer of bridge 310 and is connected to microbump 241A and microbump 241B. Interconnect 252 is routed through a second layer of bridge 310 and is connected to microbump 242A and microbump 242B. Interconnect 253 is routed through a third layer of bridge 310 and is connected to microbump 243A and microbump 243B. Interconnect 254 is routed through a fourth layer of bridge 310 and is connected to microbump 244A and microbump 244B. However, one of ordinary skill in the art will appreciate that any number of interconnects can run through any number of layers of bridge 310 (dependent on the number of layers of the bridge) and that any number of interconnects can be connected to any number of microbumps and/or standard C4s bonded to an attach region of a die (dependent on the number of attach points in an I/O attach region). Interconnects 251-254 enter/exit die 210 and die 230 via microbumps 240 bonded to an I/O attach region on die 210 and an I/O attach region on die 220. In those embodiments where microbumps 240 are replaced with C4s, interconnects 270 enter/exit die 210 and die 220 via C4s bonded to an I/O attach region on die 210 and an I/O attach region on die 220.

FIG. 4 illustrates a cross-section view of chip package 400 for interfacing between die 210 and die 220 via interconnects 251-254 routed through an interposer 410 horizontally bonded between die 210, die 220, and package substrate 230 in accordance with at least one embodiment of the present invention. In various embodiments, interposer 410 may be a glass, organic, or silicon based interposer. As depicted in FIG. 4, microbumps 240 are bonded to an I/O attach region of die 210, an I/O attach region of die 220, and interposer 410 at positions corresponding to connection points of interconnects 251-254 routed through various layers of interposer 410. However, in other embodiments, microbumps 240 are replaced with C4s (not depicted) in an I/O attach region on die 210 and an I/O attach region on die 220. In these embodiments, an I/O attach region on die 210 and an I/O attach region on die 220 is bonded to interposer 410 via C4s (not depicted) positioned at corresponding connection points of interconnects 251-254 routed through various layers of interposer 410. In various embodiments, interconnects 251-254 routed through various layers of interposer 410 may be formed from any generally known materials for transmitting signal data, including but not limited to, copper wire or tungsten.

Interconnect 251 is routed through a first layer of interposer 410 and is connected to microbump 241A and microbump 241B. Interconnect 252 is routed through a second layer of interposer 410 and is connected to microbump 242A and microbump 242B. Interconnect 253 is routed through a third layer of interposer 410 and is connected to microbump 243A and microbump 243B. Interconnect 254 is routed through a fourth layer of interposer 410 and is connected to microbump 244A and microbump 254B. However, one of ordinary skill in the art will appreciate that any number of interconnects can run through any number of layers of interposer (dependent on the number of layers of the interposer) and that any number of interconnects can be connected to any number of microbumps and/or C4s bonded to an attach region of a die (dependent on the number of attach points in an I/O attach region). Interconnects 251-254 enter/exit die 210 and die 220 via microbumps 240 bonded to an I/O attach region on die 210 and an I/O attach region on die 220. In those embodiments where microbumps 240 are replaced with C4s, interconnects 270 enter/exit die 210 and die 220 via C4s bonded to a dies respective I/O attach region.

In various embodiments, a first dedicated power supply having a first voltage level for powering I/O circuits on die 210 and a second dedicated power supply having a second, distinct voltage level for powering I/O circuits on die 220 is delivered to an I/O attach region of both die 210 and die 220 to enable a single level shift for a signal being transmitted from a first voltage domain of die 210 to a second, distinct voltage domain of die 220. As further depicted in FIGS. 2-4, each of die 210 and die 220 include a power supply ($VDD_1$) 260, power supply ($VDD_2$) 270, and common ground supply (VSS) 280. It should be noted that $VDD_1$ 260 is the logic power supply dedicated for circuits on die 210 and $VDD_2$ 270 is the logic power supply dedicated for circuits on die 220. In some embodiments, the logic power supply of $VDD_1$ 260 is greater than the logic power supply of $VDD_2$ 270. In other embodiments, the logic power supply of $VDD_1$ 260 is less than the logic power supply of $VDD_2$ 270.

As further depicted in FIGS. 2-4, C4s 290 are bonded along a first edge of an I/O attach region on die 210 and along a first edge of an I/O attach region on die 220. In FIGS. 2 and 3, C4s 290 are bonded to the bottom metal surface (i.e., backend metal surface or backside metal surface) of dies 210 and 220, and the top surface of package substrate 230 at positions corresponding to connection points of $VDD_1$ 260, $VDD_2$ 270, and VSS 280 routed through various layers of package substrate 230. However, in FIG. 4, C4s 290 are bonded to the top surface of interposer 410 rather than to package substrate 230. Additional C4s 295 are bonded to the bottom surface of interposer 410 and the top surface of package substrate 230 at positions corresponding to connection points of $VDD_1$ 260, $VDD_2$ 270, and VSS 280 routed through various layers of package substrate 230. In those embodiments where an interposer is used, such as in FIG. 4, $VDD_1$ 260, $VDD_2$ 270, and VSS 280 may pass through interposer 410 through a plurality of vias (not depicted) that are connected at a first end to C4s 295 bonded to the bottom surface of interposer 410 and at a second end to C4s 290 bonded to the top surface of interposer 410. In various embodiments, the plurality of vias (not depicted) may be, for example, through-silicon vias (TSVs) or through glass vias (TGVs).

It should be noted that $VDD_1$ 260, $VDD_2$ 270, and VSS 280 are routed through package substrate 230 utilizing thicker routing layers (and thus thicker wires) which support higher current densities compared to the thinner routing layers (and thus thinner wires) of interconnects 251-254. Similarly, C4s 290 are utilized along an edge of an I/O attach region since C4s have a larger diameter and pitch compared to microbumps, which again allows for support of higher current densities.

Figure 5:
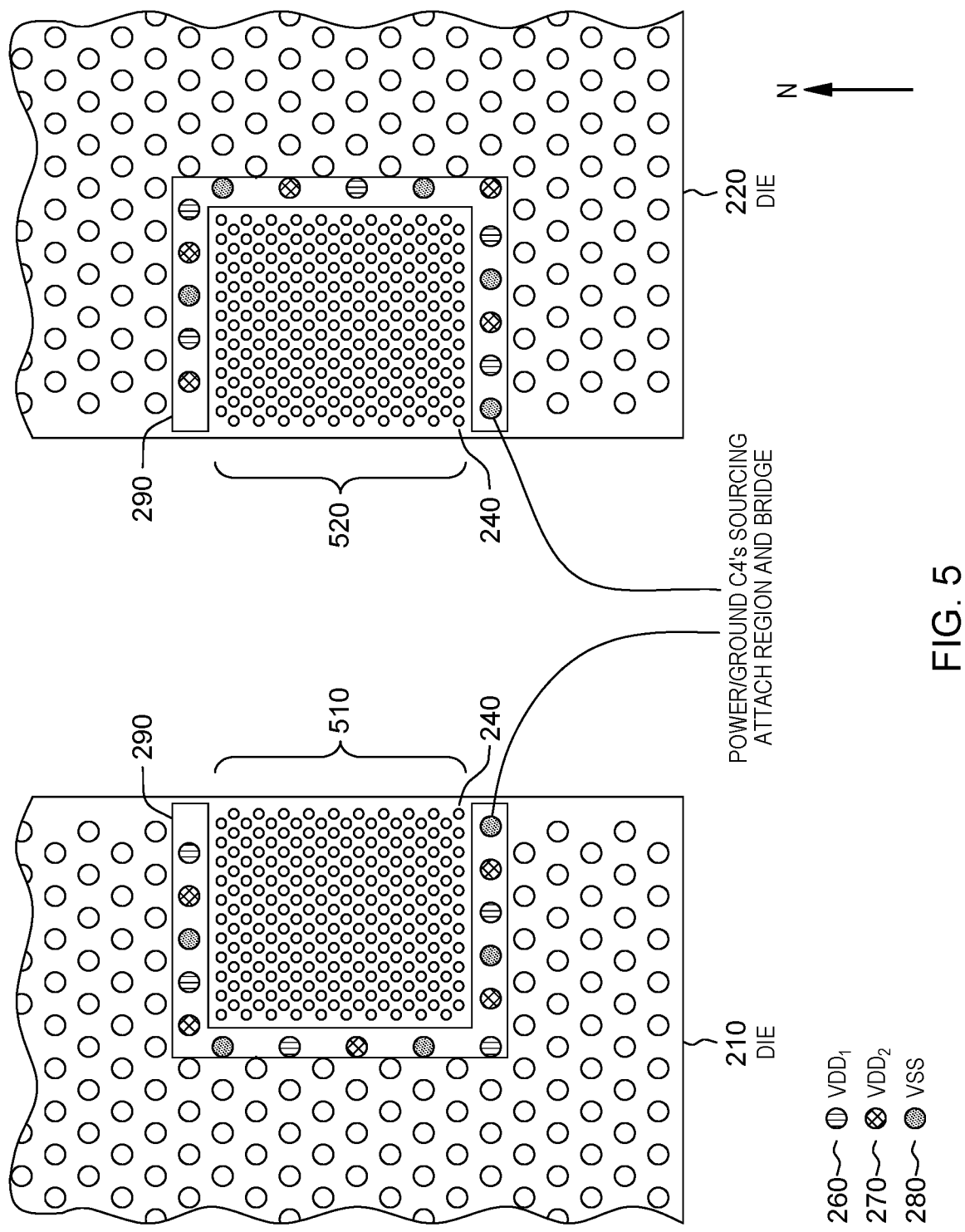
FIG. 5 is a bottom-level perspective of a high density input/output (I/O) interface of two dies that illustrates an arrangement of power and ground delivered along the perimeter of the high density I/O interface of the two dies depicted in FIGS. 3-5 in accordance with at least one embodiment of the present invention.

FIG. 5 is a bottom-level perspective of the bottom or backend metal surface of die 210 and die 220 that illustrates an arrangement of $VDD_1$ 260, $VDD_2$ 270, and VSS 280 delivered along at least a portion of a perimeter of I/O attach region 510 on die 210 and along at least a portion of a perimeter of I/O attach region 520 on die 220 in accordance with at least one embodiment of the present invention. As depicted in FIG. 5, microbumps 240 are bonded to I/O attach region 510 of die 210 and I/O attach region 520 of die 220. As further depicted, $VDD_1$ 260, $VDD_2$ 270, and VSS 280 are connected to C4s 290 bonded to the bottom surfaces of die 210 and die 220 along at least a portion of the perimeter of I/O attach region 510 and I/O attach region 520, respectively. It should be noted that power supplies $VDD_1$ 260 and $VDD_2$ 270, and ground supply VSS 280 are not directly delivered to I/O attach regions 510 and 520 occupied by microbumps 240.

It should further be noted that where two interfacing dies are horizontally bonded to a package substrate, such as die 210 and die 220 in FIG. 5, C4s 290 are not placed along a portion of the perimeter of the nearest opposing parallel edges of the I/O attach regions of the two dies 210 and 220 where the shortest interconnects are attached. For example, in FIG. 5, the eastern edge of I/O attach region 510 of die 210 and the western edge of I/O attach region 520 of die 220 are the nearest opposing parallel edges where the shortest interconnects are attached (as you move further westward with respect to I/O attach region 510 and further eastward with respect to I/O attach region 520, the length of interconnects (not depicted) connected to corresponding microbumps 240 bonded to I/O attach region 510 and I/O attach region 520 increases). This stems from the fact that if power supply and ground supply wires were connected to C4s on these edges of the I/O attach regions, the power supply and ground supply wires routed through the package substrate 230 (not depicted) would interfere with interconnects (not depicted) connected to microbumps 240 bonded to an I/O attach region 510 and 520 (or C4s in those embodiments where microbumps 240 are replaced with C4s) and routed through a top portion of layers of package substrate 230 (not depicted). Accordingly, in order to maximize the number of signal routes between I/O attach region 510 and I/O attach region 520, C4's (and corresponding power and ground supplies) should not be placed along a portion of the perimeter of the eastern edge of I/O attach region 510 and along the perimeter of the western edge of I/O attach region 520.

$VDD_1$ 260, $VDD_2$ 270, and VSS 280 enter/exit die 210 and die 220 via C4s 290 positioned along at least a portion of the perimeter of I/O attach region 510 and I/O attach region 520 and alternate between VSS 260, $VDD_1$ 270, and $VDD_2$ 280. It should be noted that power and ground assignments alternate between VSS 260, $VDD_1$ 270, and $VDD_2$ 280 to ensure even power delivery to a power grid 600 (depicted in FIG. 6 and further described below) formed within the bottom (i.e., "backend" or "backside") metal layers of an area of dies 210 and 220 corresponding to I/O attach regions 510 and 520, respectively. For example, as depicted in FIG. 5, there are fifteen C4s located along at least a portion of the perimeter of I/O attach region 510. Accordingly, the power supplies and ground supply delivered to the portions of the perimeter of I/O attach region 510 of die 210 may be arranged (moving clockwise along the perimeter of I/O attach region 240) in the following alternate pattern: VSS, $VDD_2$, $VDD_1$, VSS, $VDD_2$, $VDD_1$, VSS, $VDD_2$, $VDD_1$, VSS, $VDD_2$, $VDD_1$, VSS, $VDD_2$, $VDD_1$ (reference numbers omitted for clarity). However, in another example, the power and ground supply to I/O attach region 510 of die 210 may be arranged (moving clockwise along the portions of the perimeter of I/O attach region 240) in the following alternate pattern: VSS, $VDD_1$, $VDD_2$, VSS, $VDD_1$, $VDD_2$, VSS, $VDD_1$, $VDD_2$, VSS, $VDD_1$, $VDD_2$, VSS, $VDD_1$, $VDD_2$ (reference numbers omitted for clarity).

It should be noted that in various embodiments, power and ground assignments can form different patterns and different ratios of power supplies can be delivered along at least a portion of the perimeter of an I/O attach region 510 and 520 depending on the particular needs (e.g., performance and power requirements) of I/O circuits on a particular die 210 and 220. For example, power assignments are formed by a 2:1 ratio of $VDD_1$ and $VDD_2$, respectively along at least a portion of the perimeter of an I/O region based on a demand for higher $VDD_1$ current densities. It should further be noted that in various embodiments, power and ground assignments can form any number of rows along at least a portion of the perimeter of an I/O region depending on the particular needs (e.g., performance and power requirements) of I/O circuits on a particular die. For example, two rows of power and ground assignments are formed along at least a portion of the perimeter of an I/O region if a demand for higher current densities of $VDD_1$ and/or $VDD_2$ cannot be provided by a single row.

Additionally, it should be noted that embodiments of the present invention can be practiced utilizing more than two, distinct power supplies delivered to the perimeter of an I/O attach region 510 and 520 and connected to a power grid 600 formed within the bottom (i.e., "backend" or "backside") metal layers of an area of a die 210 and 220 corresponding to an I/O attach region 510 and 520. For example, if I/O attach region 510 on die 210 interfaces with I/O attach region 520 of die 220, and an I/O attach region of a third die (not depicted) powered by a third dedicated power supply ($VDD_3$) (not depicted), then three power supplies (e.g., $VDD_1$—a dedicated power supply for die 210, $VDD_2$—a dedicated power supply for die 220, and $VDD_3$—a dedicated power supply for the third die), in addition to a common ground supply (e.g., VSS) may be delivered to the perimeter of I/O attach region 510 and connected to a power grid 600 formed in the bottom (i.e., "backend" or "backside") metal layers corresponding to an area of I/O attach region 510 on die 210. Accordingly, three power supplies and a common ground supply positioned along the perimeter of an I/O attach region 510 and 520 may be arranged (moving clockwise along the perimeter of I/O attach region 510), for example, in the following alternate pattern: VSS, $VDD_1$, $VDD_2$, $VDD_3$, VSS, $VDD_1$, $VDD_2$, $VDD_3$, etc. (reference numbers omitted for clarity).

Figure 6:
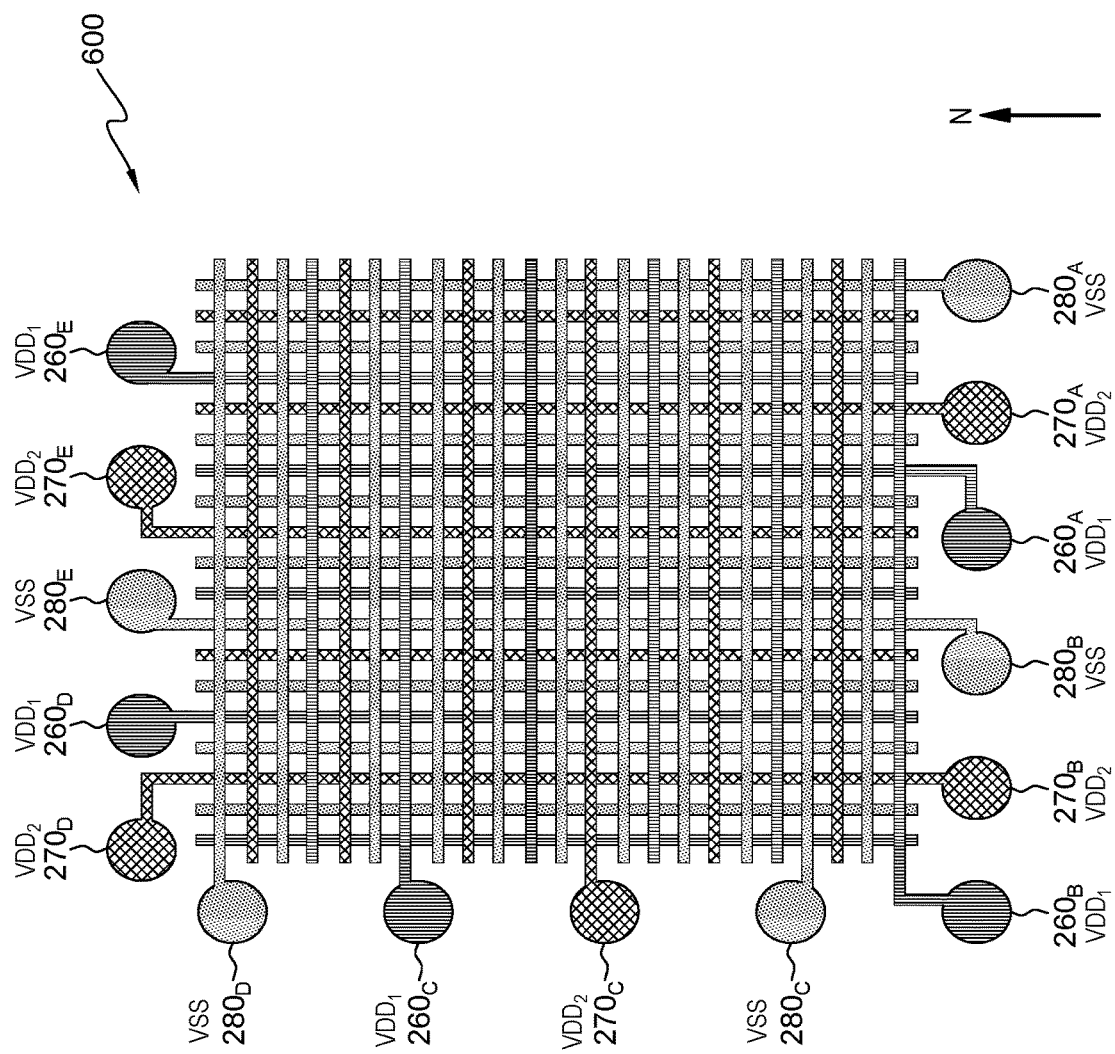
FIG. 6 is a bottom-level perspective of a power grid on a die that illustrates delivery of power and ground supplies along the perimeter of an I/O attach region of the die to a power grid located within the I/O attach region.

FIG. 6 is a bottom-level perspective of a power grid 600 on die 210 that illustrates delivery of power supplies $VDD_1$ 260 and $VDD_2$ 270, and ground supply VSS 280 along the perimeter of I/O attach region 510 of die 210 to power grid 600. It should be noted that although power grid 600 is discussed herein with reference to I/O attach region 510 of die 210, a similar power grid is constructed within the bottom ("backside" or "backend") metal layers of die 220 for delivering power to the I/O circuits at the silicon layer of die 220. However, the power grid constructed within the bottom (i.e., "backside" or "backend") metal layers of die 220 can be rotated 180° from the orientation of power grid 600 to ensure that C4s 290 are not positioned along the perimeter of the western edge of I/O attach region 520 of die 220. In various embodiments, power grid 600 is constructed within the bottom (i.e., "backside" or "backend") metal layers of die 210 and delivers power to the I/O circuits at the silicon layer of die 210. Power grid 600 receives power and ground from the power supply rails ($VDD_1$ 260 and $VDD_2$ 270) and ground supply rails (VSS 280) positioned along the perimeter of I/O attach region 510 (depicted in FIG. 5). $VDD_1$ 260, $VDD_2$ 270, and VSS 280 supply rails are connected to C4s 290 (depicted in FIG. 5) bonded to the bottom surface of die 210 at various positions along the perimeter of I/O attach region 510.

It should be noted that although power and ground supply is not delivered to I/O attach region 510, a dedicated power supply ($VDD_1$ 260) for die 210 and a distinct, dedicated power supply ($VDD_2$ 270) for die 220, as well as a common ground supply (VSS 280) is distributed across the entire area of the bottom (i.e., "backside" or "backend") metal layers of die 210 corresponding to I/O attach region 510 through power grid 600. Accordingly, active circuits mounted to die 210 and die 220 are provided with local access to both power (i.e., voltage) supplies $VDD_1$ 260 and $VDD_2$ 270, and common ground supply VSS 280. The term local access may generally be understood as those circuits that have a low resistance path to both power supplies where significant current can be drawn without causing IR drop (i.e., voltage drop) and without the need for noise decoupling for noise filtering. It should be appreciated that such local access to both voltage supplies on each interconnected die results in low complexity, low latency circuits to be used for level-translation either upstream or downstream of the I/O circuits.

As further depicted in FIG. 6, the top two layers (the layers closest to the bottom surface of die 210) of power grid 600, formed within the bottom (i.e., "backside" or "backend") metal layers of die 210, can be seen. In various embodiments, layers of power grid 600 includes $VDD_1$ 260, $VDD_2$ 270, and VSS 280, wherein traces in a layer are parallel and traces in alternating layers are perpendicular. For example, the first, topmost layer of power grid 600 is formed from parallel traces connected to the following C4s: $260_B$, $280_C$, $270_C$, $260_C$ and $280_D$. Similarly, the second, successive layer of power grid 600 is formed from parallel traces, perpendicular to the parallel traces of the first layer, connected to the following C4s: $280_A$, $270_A$, $260_A$, $280_B$, $270_B$, $270_D$, $260_D$, $280_E$, $270_E$, and $260_E$. In various embodiments, vias connect like traces between layers. For example, traces in the first layer of power grid connected to C4s $280_C$ and $280_D$ are connected by vias to wires in the second layer of power grid 600 connected to C4s $280_A$, $280_B$, and $280_E$.

Although not depicted, it should be understood that with each additional layer (moving from the top most layer of the bottom (i.e., "backside" or "backend") metal layers towards the silicon layer of die 210), the spacing between traces located within a common layer and the width or diameter of the traces located within a common layer decreases stepwise. Accordingly, as the number of layers of power grid 600 increases, the number of traces located in each successive layer also increases. In other words, the density of traces located in a layer increases with each successive layer.

Figure 7:
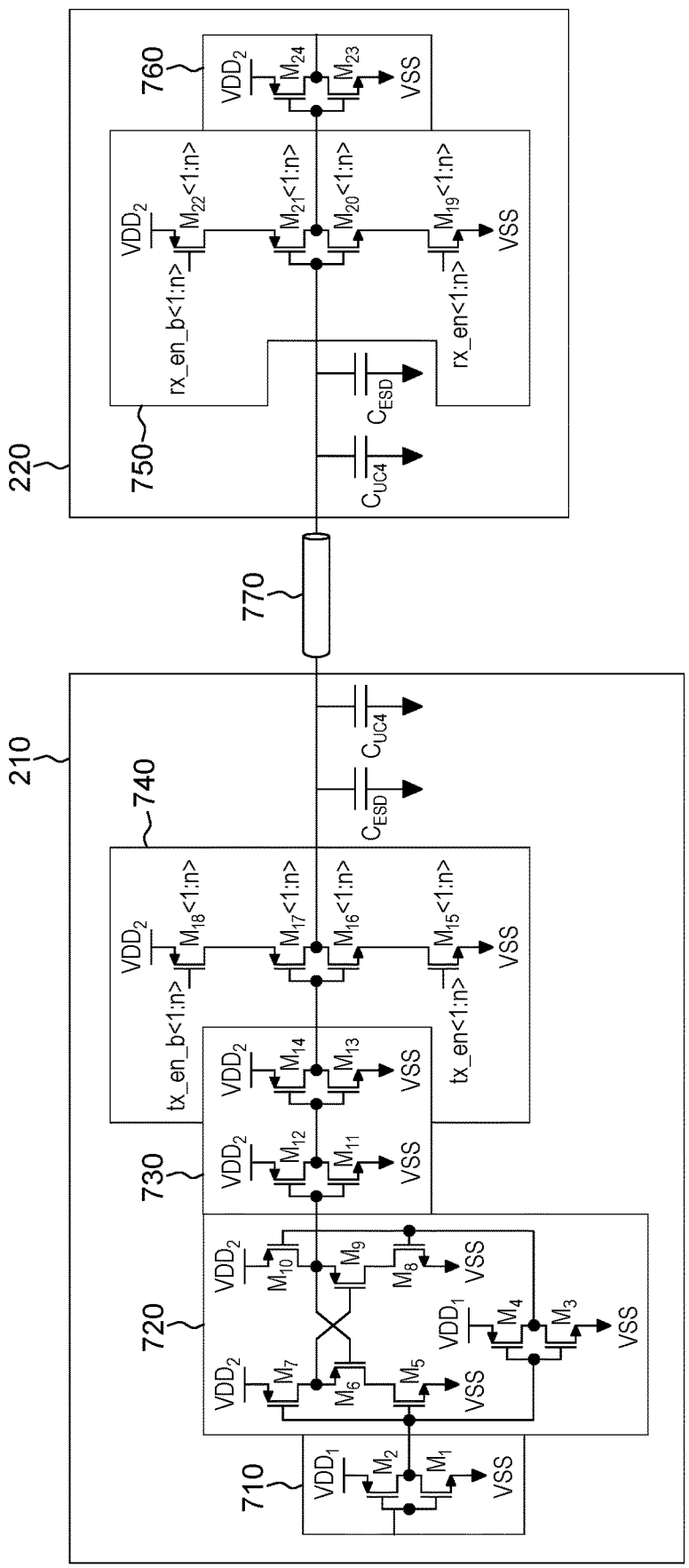
FIG. 7 is a schematic cross-section of a single-lane from a high density I/O interface of two dies that illustrates transmitting data out from a first die through a chip-to-chip interconnect to a second die. More specifically.

FIG. 7 is a schematic cross-section of a single-lane from an I/O interface (not depicted) having I/O attach region 510 (depicted in FIG. 5) driving data out from die 210, through a chip-to-chip interconnect 770, and received by an I/O interface (not depicted) having I/O attach region 520 (depicted in FIG. 5) on die 220. More specifically, FIG. 7 illustrates a single voltage level-shift for a signal upstream of driver 740 mounted on die 210. Die 210 includes inverter 710 (FETs $M_1$ and $M_2$), voltage-level translator 720 (FETs $M_5$-$M_{10}$), pre-driver 730 (FETs $M_{11}$-$M_{14}$) and driver 740 (FETs $M_{15}$-$M_{18}$). In various embodiments, inverter 710 and pre-driver 730 can be any generally known inverters, such as a complementary metal-oxide-semiconductor (CMOS). Similarly, in various embodiments, voltage-level translator 720 can be any generally known voltage-level translator, such as a differential cross-coupled CMOS voltage level-shifter. Die 220 includes I/O receiver 750 (FETs $M_{19}$-$M_{22}$) and inverter 760 (FETs $M_{23}$ and $M_{24}$). For example, inverter 760 is a CMOS.

As the signal moves downstream on die 210, the signal starts at a first logic level or voltage domain ($VDD_1$) of die 210 and is translated to a second logic level or voltage domain ($VDD_2$) of die 220 via voltage-level translator 720. The signal then passes through pre-driver circuit 730, driver circuit 740 and is received by I/O receiver 750 via interconnect 770. It should be noted that $VDD_1$ is the dedicated voltage domain necessary for the operation of devices located on die 210. Similarly, $VDD_2$ is the dedicated voltage domain necessary for the operation of devices located on die 220. However, by supplying die 210 with its own dedicated power source ($VDD_1$) and the dedicated power source from die 220 (and vice versa for die 220), only a single voltage-level translation is required for transmitting data or otherwise communicating between I/O interface 510 on die 210 and I/O interface 520 on die 220. This is further evinced by the fact that only die 210 includes a voltage-level translator.

In embodiments of the invention, the drive strength of driver 740 can be adjusted based on programmatically altering the voltage levels of FETs $M_{15}$ and $M_{18}$ via tx_en<1:n> (for FET $M_{15}$) and tx_en B<1:n> (for FET $M_{18}$). For example, decreasing the drive strength can reduce overshooting, reduce power consumption, and reduce leakage current. It should be noted that driver 740, consisting of FETs $M_{15}$-$M_{18}$, utilizes multiple parallel FET slices (as denoted by vector<1:n>), such that the effective I/O drive strength can be set through software to disable instances of a given FET. For example, if there are ten instances of each of FETs $M_{15}$-$M_{18}$, the gate voltage for each of three instances of FETs $M_{15}$ is set to high and the gate voltage for each of seven instances of FETs $M_{15}$ is set to low (i.e., the gate voltage is cut off). Correspondingly, the gate voltage for each of three instances of FETs $M_{18}$ is set to low (i.e., the gate voltage is cut off) and the gate voltage for each of seven instances of FETs $M_{18}$ is set to high. Such programmability for driver 740 can be leveraged for dies where supply voltage is set based on the measured performance of the process for the die. Accordingly, if die 210 and die 220 have significantly different performance characteristics, the voltage set point for $VDD_2$ can work against any driver circuits on die 210 downstream of voltage-level translator 720.

For example, if die 210 includes devices from a "slow" or "weak" process while die 220 includes devices from a "fast" or "strong" process, then the $VDD_2$ voltage may be set too low for the devices on die 210. In this example, the I/O drive strength of driver 740 can be increased via the tx_en/tx_en B control signals to compensate for the low $VDD_2$ voltage. In another example, if die 210 includes devices from "fast" or "strong" processes while die 220 includes devices from "weak" or "slow" processes, then the $VDD_2$ voltage may be set too high for the driver devices on die 210. In this example, the I/O driver strength can be decreased via the tx_en/tx_en B control signals to compensate for the high $VDD_2$ voltage.

Figure 8:
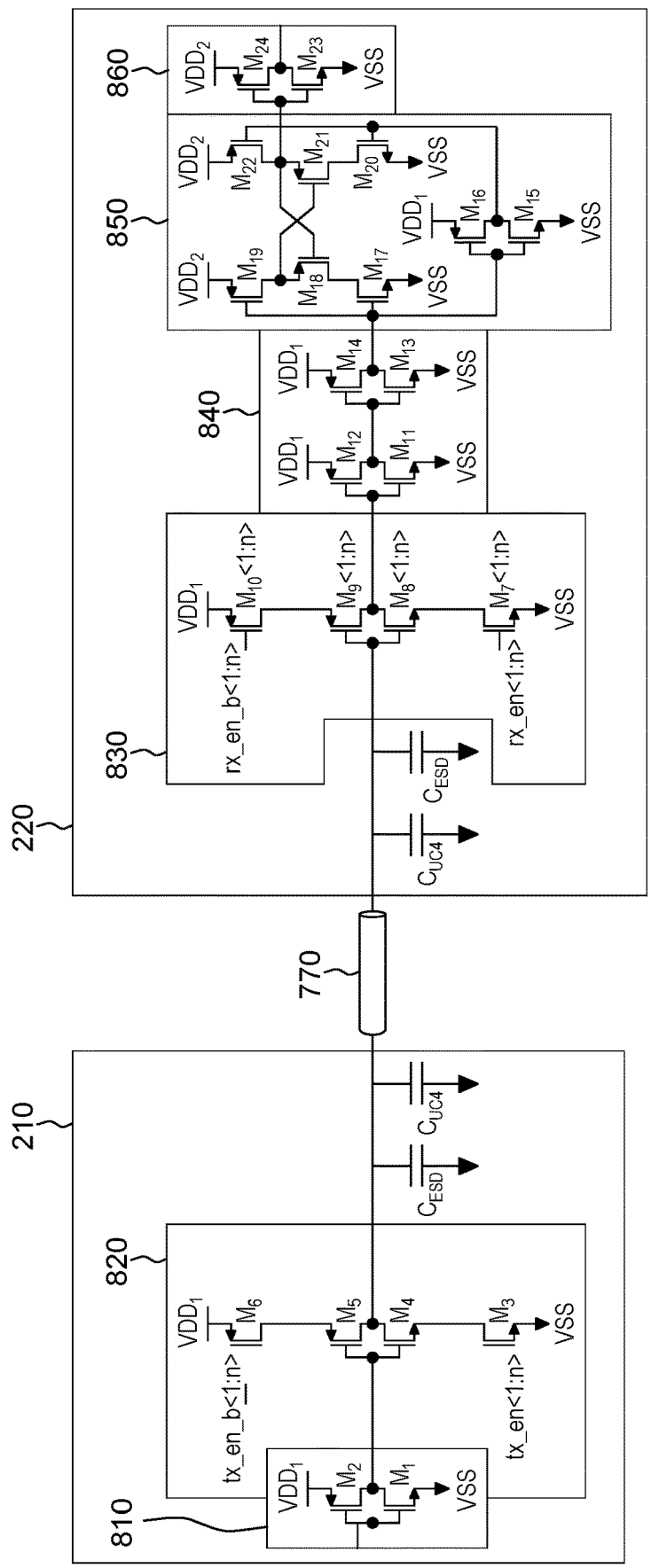
FIG. 8 is a schematic cross-section of a single-lane from a high density I/O interface of two dies that illustrates transmitting data out from a first die through a chip-to-chip interconnect to a second die. More specifically.

FIG. 8 is a schematic cross-section of a single-lane from an I/O interface (not depicted) having I/O attach region 510 (depicted in FIG. 5) driving data out from die 210, through chip-to-chip interconnect 770, and received by an I/O interface (not depicted) having I/O attach region 520 (depicted in FIG. 5) on die 220. More specifically, FIG. 8 illustrates a single voltage level-shift for a signal on die 220 downstream of I/O receiver 830 mounted on die 220. Die 210 includes pre-driver 810 and driver 820. Die 220 includes I/O receiver 830, inverters 840, voltage-level translator 850 and inverter 860. In various embodiments, pre-driver 810 and inverters 840 can be any generally known inverters, such as a CMOS. Similarly, in various embodiments, voltage level translator 850 can be any generally known voltage-level translators, such as a differential cross-coupled CMOS voltage level-shifter.

As the signal moves downstream from die 210 to die 220, the signal starts at a first logic level or voltage domain ($VDD_1$) on die 210 and is translated to a second logic level or voltage domain ($VDD_2$) of die 220 via voltage-level translator 850 located downstream of I/O receiver 830 on die 220. It should be noted that $VDD_1$ is the dedicated voltage domain necessary for the operation of devices located on die 210. Similarly, $VDD_2$ is the dedicated voltage domain necessary for the operation of devices located on die 220. However, by supplying die 210 with its own dedicated power source ($VDD_1$) and the dedicated power source (VDD$_2$) from die 220 (and vice versa for die 220), only a single voltage-level translation is required for transmitting data or otherwise communicating between an I/O interface (not depicted) of die 210 and an I/O interface (not depicted) of die 220. This is further evinced by the fact that only die 220 includes a voltage-level translator.

In embodiments of the invention, the receiver strength of I/O receiver 830 can be adjusted based on programmatically altering the voltage levels of FETs M$_7$ and M$_{10}$ via rx_en<1:n> (for FET M$_7$) and rx_en b<1:n> (for FET M$_{10}$). For example, decreasing the receiver strength can reduce overshooting, reduce power consumption, and reduce leakage current. It should be noted that receiver 830, consisting of FETs M$_7$-M$_{10}$, utilizes multiple parallel FET slices (as denoted by vector<1:n>), such that the effective I/O receiver strength can be set through software to disable instances of a given FET. For example, if there are ten instances of each of FETs M$_7$-M$_{10}$, the gate voltage for each of three instances of FETs M$_7$ is set to high and the gate voltage for each of seven instances of FETs M$_7$ is set to low (i.e., the gate voltage is cut off). Correspondingly, the gate voltage for each of three instances of FETs M$_{10}$ is set to low (i.e., the gate voltage is cut off) and the gate voltage for each of seven instances of FETs M$_{10}$ is set to high. Such programmability for I/O receiver 830 can be leveraged for dies where supply voltage is set based on the measured performance of the process for the die. Accordingly, if die 210 and die 220 have significantly different performance characteristics, the voltage set point for VDD$_2$ can work against any I/O circuits on die 220 downstream of voltage-level translator 850.

For example, if die 210 includes devices from a "slow" or "weak" process while die 220 includes devices from a "fast" or "strong" process, then the VDD$_2$ voltage may be set too high for the devices on die 220. In this example, the receiver strength of I/O receiver 830 can be decreased via the rx_en/tx_en b control signals to compensate for the low VDD$_2$ voltage. In another example, if die 210 includes devices from "fast" or "strong" processes while die 220 includes devices from "weak" or "slow" processes, then the VDD$_2$ voltage may be set too low for the receiver devices on die 220. In this example, the receiver strength of I/O receiver 830 can be increased via the rx_en/rx_en b control signals to compensate for the high VDD$_2$ voltage.

What is claimed is:

1. An input/output (I/O) interface of a die, the I/O interface of the die comprising:
   a first region of a backside of the die; and
   a second region of the backside of the die positioned along at least a portion of a perimeter of the first region, wherein the second region provides power and ground connections to the first region.

2. The I/O interface of the die of claim 1, further comprising:
   a plurality of microbumps bonded to a backside surface of the first region of the die.

3. The I/O interface of the die of claim 2, further comprising:
   a plurality of interconnects connected to the plurality of microbumps, the plurality of interconnects providing signal transmittance between the die and an additional die.

4. The I/O interface of the die of claim 1, further comprising:
   a plurality of controlled collapse chip connections (C4s) bonded to a backside surface of the second region of the die.

5. The I/O interface of the die of claim 4, wherein:
   the plurality of C4s bonded to the backside surface of the second region of the die are arranged in at least one row along at least a portion of the perimeter of the first region.

6. The I/O interface of the die of claim 4, further comprising:
   a ground supply connected to a first portion of the plurality of C4s bonded to the backside surface of the second region of the die.

7. The I/O interface of the die of claim 4, further comprising:
   a first voltage supply connected to a second portion of the plurality of C4s bonded to the backside surface of the second region of the die.

8. The I/O interface of the die of claim 7, wherein:
   the first voltage supply is a dedicated voltage supply for powering circuits connected to the die.

9. The I/O interface of the die of claim 4, further comprising:
   a second voltage supply connected to a third portion of the plurality of C4s bonded to the backside surface of the second region of the die.

10. The I/O interface of the die of claim 9, wherein:
    the second voltage supply is a dedicated voltage supply for powering circuits located on an additional die that is interconnected to the die.

11. The I/O interface of the die of claim 1, further comprising:
    a power grid formed within at least two backside metal layers of the die and connected to the second region, wherein the power grid spans an area encompassed by the first region.

12. The I/O interface of the die of claim 1, wherein:
    an arrangement of at least a first voltage supply, a second voltage supply and a ground supply along at least a portion of the perimeter of the first region is dependent on respective power requirements of circuits located on the die.

13. The I/O interface of the die of claim 1, wherein:
    an arrangement of at least a first voltage supply, a second voltage supply and a ground supply along at least a portion of the perimeter of the first region is dependent on respective performance requirements of circuits located on the die.

14. A method of fabricating an input/output (I/O) interface of a die, the method comprising:
    bonding a backside surface of a first region of the die to a corresponding topside surface of a first region of a package substrate via a plurality of microbumps; and
    bonding a backside surface of a second region of the die positioned along at least a portion of a perimeter of the first region to a corresponding topside surface of a second region of a package substrate via a plurality of controlled collapse chip connections (C4s), wherein:
    the second region of the die delivers power to the first region of the die.

15. The method of claim 14, further comprising:
    arranging the plurality of C4s in at least one row along at least the portion of the perimeter of backend surface of the first region.

16. The method of claim 14, further comprising:
    routing a plurality of interconnects through a plurality of topside layers of the package substrate; and
    connecting each interconnect in the plurality of interconnects to a single microbump in the plurality of microbumps.

17. The method of claim 15, further comprising:
routing a ground supply rail through a first backside layer of the package substrate; and
connecting the ground supply rail to a first portion of the plurality of C4s bonding the second region of the backside surface of the die to the corresponding second region of the topside surface of the package substrate.

18. The method of claim 15, further comprising:
routing a first voltage supply rail through a second backside layer of the package substrate; and
connecting the first voltage supply rail to a second portion of the plurality of C4s bonding the second region of the backside surface of the die to the corresponding second region of the topside surface of the package substrate.

19. The method of claim 15, further comprising:
routing a second voltage supply rail through a third backside layer of the package substrate; and
connecting the second voltage supply rail to a third portion of the plurality of C4s bonding the second region of the backside surface of the die to the topside surface of the package substrate.

20. The method of claim 15, further comprising:
forming a power grid within at least two backside metal layers of the die; and
connecting the power grid to the plurality of C4s bonding the second region of the backside surface of the die to the topside surface of the package substrate, wherein:
the power grid spans an area encompassed by the first region; and
the power grid delivers power to circuits located on the die.

* * * * *